Nov. 30, 1965 W. P. MARGOPOULOS 3,221,324

ANALOG TO DIGITAL CONVERTER

Filed Oct. 26, 1960

INVENTOR
WILLIAM P. MARGOPOULOS

BY

ATTORNEY

United States Patent Office 3,221,324
Patented Nov. 30, 1965

3,221,324

ANALOG TO DIGITAL CONVERTER

William P. Margopoulos, Poughkeepsie, N.Y., assignor to International Business Machines Corporation, New York, N.Y., a corporation of New York Filed Oct. 26, 1960, Ser. No. 65,038
7 Claims. (Cl. 340—347)

This invention relates to analog-to-digital converters. More particularly, this invention relates to a system for obtaining a digital representation of the peaks or troughs of analog signals.

One of the major limitations in prior analog-to-digital converters utilized for peak sensing, has been the frequency at which the voltage to be digitized changes. Several prior art devices for digitizing the peaks and troughs of a varying voltage have been shown wherein a reversible counter is caused to follow a varying voltage by selectively gating pulses from an oscillator to the counter. As long as the varying voltage differs from a reference voltage generated by the count in the counter, a gate will allow the oscillator pulses to enter the counter. When the reference voltage equals the varying voltage, the oscillator pulses will be blocked to the counter and the counter contents read out.

Up to this point in the operation of most prior art devices, an indication was made that the reference voltage generated by the counter equaled the varying analog voltage. This only indicates that the two voltages are equal and would not necessarily indicate that the varying voltage has reached a peak. Each oscillator pulse presented to the counter will increase or decrease the counter by a fixed amount. It is quite possible that the varying voltage rate of change would be low enough near the peak that the gate would remain open and the counter would count an oscillator pulse which would increase the reference voltage the fixed amount and would indicate a zero difference between the two voltages. This problem will require that the oscillator pulses causing the counter to increase the reference voltage in fixed steps be closely related in frequency to the frequency of the varying voltage. The prior art devices must therefore be able to predict that at the first crossing of the reference voltage with the varying voltage, a peak has actually occurred.

The prior art devices which causes oscillator pulses to be gated to a reversible counter are further limited in that the oscillator is a fixed frequency and can only count at a predetermined rate. This then produces a limiting factor to the frequency and amplitude of the varying voltage which can be accurately followed by the counter.

The principal object of this invention is to provide the digital value of peaks and troughs of a varying unknown voltage at a much higher frequency than previously obtained.

Another object of this invention is to provide a digital representation of peaks and troughs of varying voltages wherein a reversible counter is increased or decreased a variable amount by a single oscillator pulse.

It is also an object of this invention to provide means whereby a reversible counter may be increased or decreased variable amounts by a single oscillator pulse but which is never increased or decreased an amount more than the difference between a reference voltage generated by said counter and the unknown varying voltage.

Another object of this invention is to provide a digital representation of peaks and troughs of a varying voltage wherein the digital contents of a reversible counter are not read until an actual peak or trough has been realized.

An additional object of this invention is to provide a digital representation of peaks and troughs of a varying voltage wherein the digital contents of a reversible counter are not read until an actual peak or trough has been realized, the frequency of the occurrence of said peaks and troughs being variable from zero to a maximum never before obtained by prior art devices and independent of the frequency of counting pulses.

These and other objects of this invention are realized in a system wherein a multiorder counter produces a reference voltage proportional to the contents of the counter. The reference voltage is compared with the unknown varying voltage and an indication is given as to the magnitude of the difference between said voltages in relation to the weighted values of the orders of the counter. This difference magnitude indication is then effective to increase or decrease the contents of the counter an amount proportional to said relationship. Means are also provided, responsive to an indication that the unknown varying voltage and the reference voltage are equal, to cause said counter contents to be read out to a utilization device.

The foregoing and other objects, features and advantages of the invention will be apparent from the following more particular description of a preferred embodiment of the invention, as illustrated in the accompanying drawings.

Figures 1, 2:
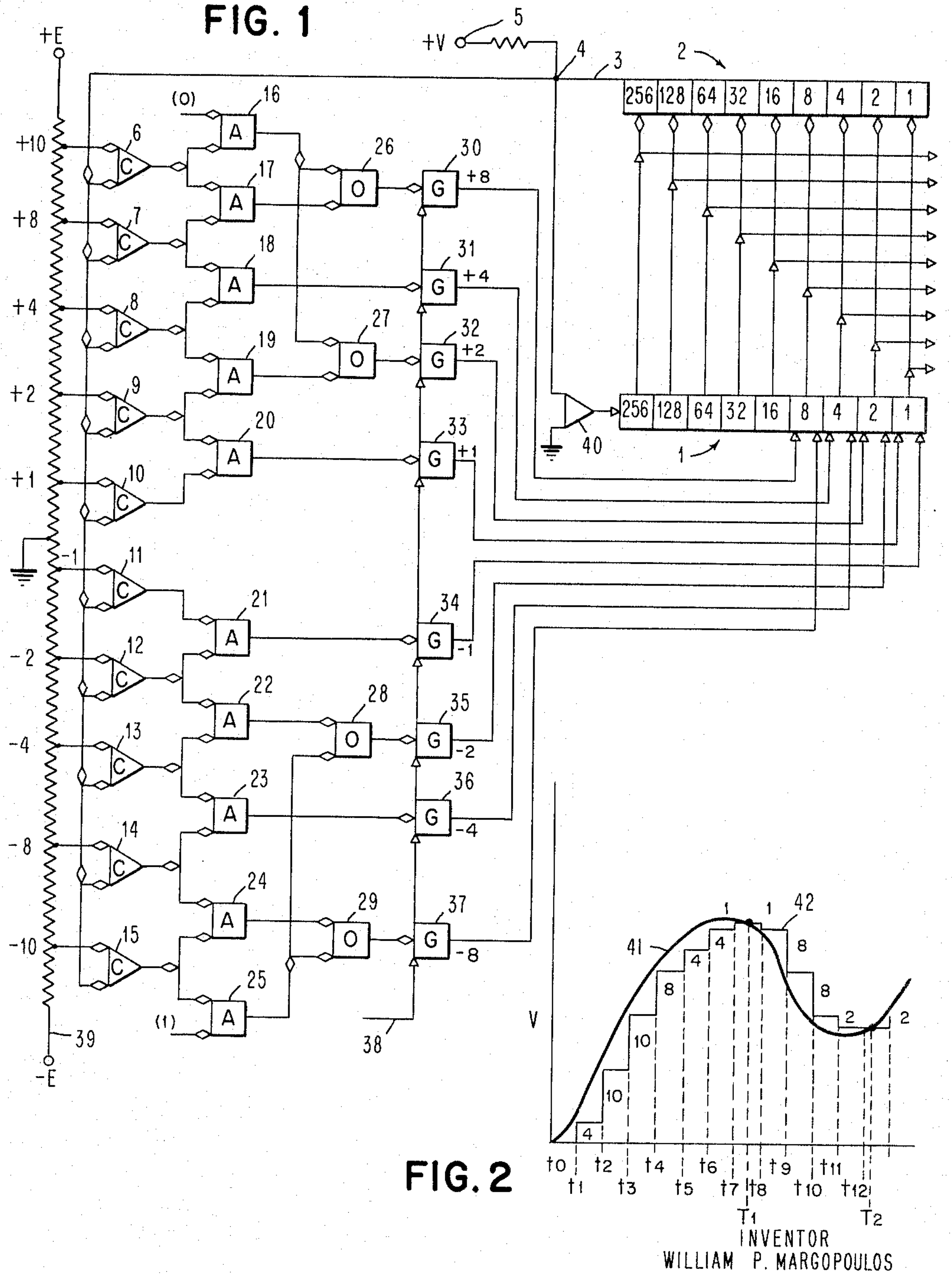
FIGURE 1 is a logical block diagram showing the logic necessary for the realization of a peak sensing digitizer of this invention.
FIGURE 2 is a representation of a varying unknown voltage and the manner in which the reference voltage generated by a counter is caused to follow the unknown voltage.

A preferred embodiment of the invention generally includes a multiorder reversible counter 1 which causes a voltage proportional to the count in the counter 1 to be generated through a series of voltgae switches 2, on line 3 to a summing junction 4. Also applied to the summing junction 4 is a varying unknown voltage at terminal 5, the peaks and troughs of which are to be recorded as a digital representation. The voltage generated on line 3 from the voltage switches 2 is a negative voltage as compared to the positive unknown voltage applied at terminal 5. The summing junction 4 therefore provides a voltage equal to the difference between the varying unknown voltage at terminal 5 and the count responsive voltage on line 3.

The difference voltage at the summing junction 4 is applied to comparing means which includes a series of comparators or difference amplifiers 6–15. The comparators 6–15 provides a logic input to comparator responsive means which include a series of AND circuits 16–25 and OR circuits 26–29.

AND circuits 16–25 and OR circuits 26–29 provide logic inputs to a series of gating circuits 30–37. Gates 30–37 provide inputs to the multiorder counter 1 to cause the counter 1 to be varied in an increasing or decreasing manner in steps equal to the input to the binary weighted orders. Gates 30–37 are sampled by a pulse from a source not shown on line 38, which samples all the gates simultaneously to determine which of the several gates 30–37 has been conditioned by the comparator responsive means.

Comparators 6–15 are biased by a corresponding plurality of taps on a voltage divider 39. The comparators 6–15 are biased at a particular voltage corresponding to amounts by which the reversible counter 1 is to be varied.

The operation of the preferred embodiment of the invention ultimately provides a digital representation of the peaks and troughs of a varying voltage when the difference between the count responsive voltage on line 3 equals the unknown varying voltage at terminal 5. At this time the voltage at the summing junction 4 will approach zero volts and change sign to the opposite polarity. This condition is recognized by a comparator 40 which will provide a change in its output state to the counter 1 to cause the contents of the counter to be read out to a recording or utilizing device. The change in polarity can also be recognized by comparators 10 and 11 to cause read-out.

In FIGURE 1 there is shown a nine stage reversible binary counter 1. Add or subtract pulses are shown being applied to binary weighted orders 1, 2, 4 and 8. In the embodiment shown, the counter 1 may be increased or decreased an amount equal to the binary weight of these orders. Whenever the contents of the counter 1 are to be altered, a single add pulse or subtract pulse will be applied to the binary input of a particular order of the counter. The binary counter 1 may be any suitable reversible counter known to those skilled in the art. Carries are produced to a next higher order in the counter, and are applied to the binary input of that order. An add carry to a next higher order will be generated from a particular order when the stable state of that order changes from "1" to "0." A subtract carry will be generated to a next higher order when the binary input to a particular order causes that order to change from the "0" stable state to the "1" stable state.

A logical "1" in a particular order of the counter 1 will cause a corresponding voltage switch to produce a voltage on line 3 proportional to that order. In the embodiment shown in the drawing, the orders of the counter are designated by their binary weights. To keep the discussion less complicated, voltages will be referred to by binary weights, with the understanding that a one unit increase in the contents of the counter may produce any desired increase in voltage. In the following discussions it will be apparent that the counter 1 is capable of counting to a maximum of 511 units. Any desired factor may be applied in accordance with the maximum unknown varying voltage which is to be applied to the system. In at least one actual embodiment of the invention a unit increase of the counter 1 would produce a 39.1 millivolt increase in the count responsive voltage produced on line 3. In this particular embodiment the allowable maximum unknown voltage was approximately 20 volts.

Before proceeding further with a more detailed description of FIGURE 1, reference is now made to FIGURE 2 which shows the manner in which the counter responsive voltage of line 3 is caused to follow and subtract from the unknown voltage applied at terminal 5. In FIGURE 2, curved waveform 41 represents the varying unknown voltage applied at terminal 5. The stair-step waveform 42 represents the reciprocal of the count responsive voltage on line 3. As previously mentioned, the peak condition in the unknown voltage was to be recognized when the difference between the unknown voltage and the count responsive voltage has approached zero and changed polarity. To insure that false peaks or troughs are not generated, the count of the counter 1 is not allowed to be altered unless the difference between the unknown voltage and the count responsive voltage is greater than the number of bits the counter will increase. That is, to take an increase of 1 bit, the error signal must be at least 1.50 bits; to take a count of 2 bits, the error signal must be at least 2.50 bits, etc.

When the peak or trough is recognized, by the comparator 40, the counter is advanced one least significant bit for a peak, or decreased one least significant bit for a trough. In this manner, the bias built into the system, to make a workable system, is eliminated in the output.

At time $t_1$ in FIGURE 2 it is shown that the difference between the unknown voltage and the count responsive voltage is approximately 7 units. An increase of 8 units at this time would have caused a crossing indicating a peak. Therefore through the operation of the invention the contents of the counter are caused to be increased by only 4 units. At time $t_2$ it is seen that the difference between the unknown voltage and the count responsive voltage is approximately 12 units, however the contents of the counter are increased by only 10 units. The maximum amount in the actual and preferred embodiment of the invention by which the counter 1 can be increased or decreased is 10 units. A 10 unit increase or decrease is provided by pulsing both the "8" and "2" positions of the counter 1. At time $t_3$ the difference of approximately 11 units causes an increase of 10 units. At $t_4$ the difference of approximately 10 units will cause an increase of 8 units. At $t_5$ a difference of approximately 8 units causes an increase in the counter of 4 units. At time $t_6$ an approximate 6 unit differenece will cause a 4 unit increase. At time $t_7$, the difference of approximately 2 units will cause a 1 unit increase in the counter. Although the peak of the waveform 41 is shown to have occurred at a time between $t_6$ and $t_7$, it is not until time $T_1$ after time $t_7$, that the peak is indicated and the digital contents of counter 1 read out. In this manner it is not until an actual peak has occurred in the waveform 41 and the waveform is changing in an opposite sense that the digital quantity in the counter is read out, after being increased by one least significant bit. In the actual and preferred embodiment of the present invention the difference between the actual peak of waveform 41 and the digital quantity contained in the counter 1 produces only a 0.25% error at full range and at maximum frequency. This accuracy and speed is far in excess of prior known peak digitizers.

Once the waveform 41 starts a negative transition, the counter responsive voltage will be caused to be maintained at a value slightly greater than the unknown voltage to again insure that a change of polarity of the error signal is not indicated before an actual trough is realized in the unknown voltage. Therefore at time $t_8$ a difference of approximately 2 units between the count responsive voltage and the unknown voltage will cause a 1 unit decrease in the contents of the counter. At time $t_9$ an approximate 9 unit difference will cause an 8 unit decrease. Time $t_{10}$ produces an 8 unit decrease in the counter. At time $t_{11}$ a difference of approximately 3 units will cause a 2 unit decrease in the contents of the counter. As was the case upon the positive transition of waveform 41, an actual trough occurs at approximately time $t_{11}$. At time $t_{12}$ it is seen that the count responsive voltage is still greater than the unknown voltage but the difference is less than 1 unit, therefore the contents of the counter are not changed. At time $T_2$ when the varying voltage waveform 41 crosses the count responsive waveform and the change in polarity of the error signal is recognized, the contents of the counter will be read out to the utilization device.

A detailed description of how the contents of the counter are caused to be varied an amount less than the difference between the unknown voltage and the count responsive voltage is shown in FIGURE 1. Comparators 6–10 indicate when the contents of the counter 1 should be increased and comparators 11–15 indicate when the contents should be decreased. An increase is called for when the unknown voltage at terminal 5 exceeds the count responsive voltage on line 3 at the summing junction 4. Comparators 6–15 conduct and produce a logical "1" output whenever the difference voltage at summing junction 4 is more positive than the bias voltage from divider 39. For example, if the unknown voltage exceeds the count responsive voltage by more than 10 units all of the comparators 6–15 will produce a logical output.

The comparator responsive AND circuits 16–25 indicate the most positively biased comparator that is producing a logical output. This is accomplished by requiring that the two inputs to each AND circuit must be a particular logical combination. This logical combination is such that a particular AND circuit will produce a logical output only when the top input in the drawing is a logical "0" and the bottom input is a logical "1."

The comparator responsive AND circuits 16–25 and OR circuits 26–29 will condition gates 30–37. If there is to be a maximum increase of 10 units, gates 30 and 32 will be conditioned and will produce an output at the time of sampling on line 38. Likewise if there is to be for an example a 4 unit decrease in the contents of the counter, gate 36 will have been conditioned and will produce an output at the time of the sampling pulse on line 38.

The manner in which the logic of FIGURE 1 is caused to produce the results shown in FIGURE 2 will now be discussed. At time $t_1$, it is shown that the unknown voltage exceeds the count responsive voltage by approximately 7 units. The positive difference voltage at summing junction 4 of approximately 7 units is applied to comparators 6–15. The difference of 7 units will cause comparators 8–15 to produce a logical "1" output as the difference is more positive than their respective bias voltages. AND circuits 16 and 17 have both logical inputs "0" and will not produce an output. AND circuit 18 has at its top input a logical "0" from comparator 7 and a logical "1" from comparator 8 which is conducting Therefore AND circuit 18 will be producing a logical output to gate 31. AND circuits 19–25 have logical "1" at both inputs and will not produce logical outputs. Therefore gate 31 is the only gate conditioned at the time of sampling at $t_1$, and the contents of counter 1 will be increased by 4 units at the 4 weighted binary order.

At time $t_2$ the difference between the unknown voltage and the count responsive voltage is shown to be approximately plus 12 units. At the time of the sampling pulse on line 38 therefore, all of the comparators 6–15 will be producing logical "1" outputs, conditioning only AND circuit 16 which has a fixed logical "0" at its top input. In this case OR circuits 26 and 27 will cause gates 30 and 32 to be conditioned and the contents of counter 1 will be increased by 10 units.

At time $t_7$ it is shown that the difference between the unknown voltage and the count responsive voltage is approximately plus 2 units. Comparator 9 will not be energized as the positive difference must exceed the bias voltage provided by divider 39. In this case comparators 10–15 will be producing logical outputs causing only AND circuit 20 to be conditioned which in turn conditions gate 33 to cause a 1 unit increase in counter 1.

At time $T_1$ it is shown that the unknown voltage and the count responsive voltage are equal producing a zero difference. At about this time comparator 40 will indicate a change in polarity of the error signal and cause counter 1 to be incremented one unit and be read out presenting the digital value of the peak of waveform 41 to the utilization device.

At time $t_8$ it is seen that the count responsive voltage exceeds the unknown voltage. A negative difference will be indicated at summing junction 4. The negative difference is shown to be approximately 2 units. The negative 2 unit difference does not exceed the negative 2 unit bias on comparator 12 and is considered more positive, therefore comparators 12–15 will be producing logical "1" outputs because the negative difference between the unknown voltage and the count responsive voltage is still more positive than the negative bias on these comparators. Therefore comparator 11 will not be conducting and comparator 12 will be conducting satisfying the logical conditions at AND circuit 21. At time $t_8$ therefore the sample pulse on line 38 will cause an output from gate 34 indicating that the contents of the counter 1 should be decreased by 1 unit. At time $t_9$ there is shown to be a negataive difference of approximately 9 units. In this case the difference voltage is more positive than −10 units and more negative than −8 units. For this reason AND circuit 24 will be conditioned by a logical "0" from comparator 14 and a logical "1" from comparator 15 and gate 37 will be conditioned through OR circuit 29 to cause the contents of counter 1 to be decreased by 8 units.

At time $t_{12}$, the contents of counter 1 will not be altered because the difference between the counter responsive voltage and the unknown voltage is more positive than the bias on comparator 10 which condition causes none of the AND circuits 16–25 to be conditioned with the proper logical inputs.

As shown in FIGURE 2 at time $T_2$ a change in polarity of the error signal at the summing junction 4 is indicated at comparator 40 and the digital quantity contained in counter 1 will be decreased by one bit and read out to a utilization device.

There has been shown in the previous discussion a peak and trough digitizer which is not limited in the frequency of the unknown voltage variations by a counter which can be increased or decreased by only a single unit. Inaccuracies in the contents of the counter during the rapid transition of the waveform are ignored, whereas accurate and minute changes in the contents are made when the varying voltage is nearing a peak or trough.

Another important factor of the above-described invention is the fact that false peaks and troughs are not recorded by controlling through decisions circuitry the amount by which the contents of a digital counter can be varied.

In the particular embodiment shown wherein there is a 9 order reversible binary counter and inputs to the 4 orders shown, the varying voltage may vary from a full range of 0 to 511 units at a frequency of approximately 1,200 cycles per second. The only limiting factor in the frequency being the speed of response of the analog circuits. This is a frequency greatly in excess of those achieved by prior art devices. It can easily be seen that higher frequencies are possible by either reducing the number of orders of the counter 1, thereby decreasing the maximum voltage variation, or by providing a larger maximum number of units by which the counter can be varied. A larger maximum alteration of the counter could be achieved by providing additional comparators, AND circuits, OR circuits and gates.

While the invention has been particularly shown and described with reference to a preferred embodiment thereof, it will be understood by those skilled in the art that the foregoing and other changes in form and details may be made therein without departing from the spirit and scope of this invention.

What is claimed is:

1. An analog to digital converter comprising in combination:

a multi-order reversible binary counter, the respective orders of which have weighted binary values, means responsive to the count in said counter for producing a voltage output proportional to such count, comparing means operatively connected to said count-responsive voltage means and to a source of a varying unknown voltage for furnishing a selected output representing the highest setting of said counter having a weighted value less than the magnitude of the difference between the count-responsive voltage and the unknown voltage with which it is being compared, gating means connected to a plurality of predetermined orders of said counter, responsive to said comparing means output, for altering the count in said counter at the related ones of said predetermined orders, and means operatively connected to said unknown voltage source and to said count-responsive voltage means, responsive to a change in polarity of the difference between said voltages, for causing the count in said counter to be read out.

2. A converter in accordance with claim 1 wherein said comparing means includes voltage divider means and a plurality of comparators biased by a corresponding plurality of taps on said divider means, each of said comparators being biased to a voltage corresponding to a weighted binary order of said counter.

3. A converter in accordance with claim 2 wherein said voltage divider means provides pairs of positive and negative bias voltages corresponding to binary weighted orders in said counter.

4. A converter in accordance with claim 3 wherein said comparators produce a logical output only when said difference voltage is more positive than the bias voltage to said comparator.

5. A converter in accordance with claim 4 wherein said comparing means includes comparator responsive means for indicating the most positively biased of said comparators which is producing a logical output.

6. A converter in accordance with claim 5 wherein said comparing means includes gating means responsive to a corresponding one of said comparator responsive means, which is in turn responsive to said positively biased comparators, for increasing the count in said counter at said predetermined weighted order.

7. A converter in accordance with claim 5 wherein said comparing means includes gating means responsive to a corresponding one of said comparator responsive means, which is in turn responsive to said negatively biased comparators, for decreasing the count in said counter at said predetermined weighted order.

References Cited by the Examiner

UNITED STATES PATENTS

| | | | |
|---|---|---|---|
| 2,836,356 | 5/1958 | Forrest et al. | 340—347 |
| 2,658,139 | 11/1959 | Abate | 340—347 |
| 3,124,794 | 3/1964 | Patmore | 340—347 |

MALCOLM A. MORRISON, *Primary Examiner.*

IRVING L. SRAGOW, *Examiner.*